(12) United States Patent
Kamijo

(10) Patent No.: US 6,252,223 B1
(45) Date of Patent: Jun. 26, 2001

(54) ROTARY ENCODER HAVING A DISK WITH A CONDUCTIVE PATTERN

(75) Inventor: Yutaka Kamijo, Saitama (JP)

(73) Assignee: Asahi Kogaku Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/328,444

(22) Filed: Jun. 9, 1999

(30) Foreign Application Priority Data

Jun. 16, 1998 (JP) .................................................. 10-168354

(51) Int. Cl.⁷ ...................................................... G01D 5/34
(52) U.S. Cl. ................................. 250/231.13; 250/231.18
(58) Field of Search ........................ 250/231.13, 231.18, 250/221; 341/13

(56) References Cited

U.S. PATENT DOCUMENTS 5,057,684 * 10/1991 Service ............................ 250/231.13

* cited by examiner

*Primary Examiner*—Que T. Le
(74) *Attorney, Agent, or Firm*—Greenblum & Bernstein P.L.C.

(57) ABSTRACT

A rotary encoder 10 comprises a rotary shaft 12 supported for rotation about its axis AX and a disk 16 made of an insulating substrate with a conductive pattern 17 formed on a side surface thereof. The rotary shaft 12 has a pair of axially-extending, threaded holes 14a and 14b formed therein at its one end. The desk 14 is fixedly secured to the rotary shaft 12 by means of a pair of set screws 19a and 19b threadably engaged into the threaded holes 14a and 14b formed in the rotary shaft 12 such that the disk 16 is rotatable about a rotational center defined by the axis AX of the rotary shaft 12. A plurality of electrical contacts 20a–20e are fixedly mounted on a circuit board 22 and so arranged as to be in contact with the conductive pattern 17 depending on the angular position of the disk 16 such that various combinations of the electrical contacts 20a–20e may be electrically interconnected one another depending on the angular position of the disk 16. The threaded holes 14a and 14b and the set screws 19a and 19b are located off-center with respect to the rotational center of the disk 16 and along a circle centered to the rotational center of the disk 16. The conductive pattern 17 has a central portion 18 covering the region of the rotational center of the disk 16. The electrical contacts 20a–20e include a centered electrical contact 20a so arranged as to be in contact with the conductive pattern 17 substantially at the rotational center of the disk 16. By virtue of the above, the overall size of the rotary encoder 10 may be minimized while the disk 16 may be safely secured to the rotary shaft 12 with reduced possibility of loosening during use.

5 Claims, 3 Drawing Sheets

ROTARY ENCODER HAVING A DISK WITH A CONDUCTIVE PATTERN

The present disclosure relates to subject matter contained in Japanese Patent Application No. Hei-10-168354 filed on Jun. 16, 1998, which is expressly incorporated herein by reference in its entirety.

BACKGROUND OF THE INVENTION

1. Field of the Invention

The present invention relates to a rotary encoder.

2. Description of the Related Art

Rotary encoders are commonly used in a variety of applications. For example, many electronically-controlled cameras use a rotary encoder. An electronically-controlled camera uses electronics circuitry for controlling operations of the camera. When the user of the camera wishes to take a picture at his desired aperture or shutter speed, and/or with a certain correction to the exposure value, he/she has to enter corresponding parameter(s) into the electronics circuitry. The entry of parameters is often made using a dial supported on a rotary shaft, which is typically connected to a rotary encoder for converting angular positions of the dial into corresponding electrical signals.

A rotary encoder for use in a small-size electronic apparatus, such as an electronically-controlled camera as described above, is required to be compact among others requirements.

A typical rotary encoder for such purposes comprises a rotary shaft adapted to be supported for rotation about its axis, a disk fixedly secured to the rotary shaft and made of an insulating substrate with a conductive pattern formed on a side surface thereof, and a plurality of electrical contacts adapted for fixed mounting and so arranged as to be in contact with the conductive pattern depending on the angular position of the disk such that various combinations of the electrical contacts may be electrically interconnected one another depending on the angular position of the disk.

For a small-size rotary encoder having this arrangement, the reduction in volume of the structure for securing the disk to the rotary shaft is critical because the relative volume of this structure to the overall volume of the rotary encoder increases as the latter volume is decreased.

One typical structure for securing the disk to the rotary shaft includes mating portions formed on the disk and the rotary shaft and a single set screw for retaining the disk to the rotary shaft. The mating portions serve to define the relative angular position of the disk to the rotary shaft and prevent any angular displacement between them. The disk has a central hole formed therein and the rotary shaft has an axially-extending, central threaded hole formed therein. The set screw is passed through the hole in the disk and threadably engaged into the threaded hole in the rotary shaft.

However, since such a single set screw engaged into a central threaded hole in the rotary shaft is subject to unintentional loosening during use, a relatively large set screw is required for this purpose, resulting in a large volume of the structure for securing the disk to the rotary shaft and thus in a large overall size of the rotary encoder.

Use of two or more set screws located off-center with respect to the rotational center of the disk may be effective for preventing unintentional loosening and smaller set screws may be used in such arrangement. However, this arrangement may raise another problem that any set screws so located goes around the rotational center of the disk, which requires more space on the disk, still resulting in a large overall size of the rotary encoder.

SUMMARY OF THE INVENTION

In view of the foregoing, it is an object of the present invention to provide a rotary encoder comprising a rotary shaft and a disk fixedly secured to the rotary shaft, in which the overall size of the rotary encoder may be minimized while the disk may be safely secured to the rotary shaft with reduced possibility of loosening during use.

In accordance with one aspect of the present invention, there is provided a rotary encoder comprising a rotary shaft adapted to be supported for rotation about its axis and having at least one axially-extending, threaded hole formed therein at its one end. The rotary encoder further comprises a disk made of an insulating substrate with a conductive pattern formed on a side surface thereof. The disk is fixedly secured to the one end of the rotary shaft by means of at least one set screw threadably engaged into the at least one threaded hole formed in the rotary shaft such that the disk is rotatable about a rotational center defined by the axis of the rotary shaft. The rotary encoder further comprises a plurality of electrical contacts adapted for fixed mounting and so arranged as to be in contact with the conductive pattern depending on the angular position of the disk such that various combinations of the plurality of electrical contacts may be electrically interconnected one another depending on the angular position of the disk. The at least one threaded hole and the at least one set screw is located off-center with respect to the rotational center of the disk. The conductive pattern has a central portion covering the region of the rotational center of the disk. The plurality of electrical contacts include a centered electrical contact so arranged as to be in contact with the conductive pattern substantially at the rotational center of the disk.

In accordance with another aspect of the present invention, there is provided a rotary encoder comprising a rotary shaft adapted to be supported for rotation about its axis and having a plurality of axially-extending, threaded holes formed therein at its one end. The rotary encoder further comprises a disk made of an insulating substrate with a conductive pattern formed on a side surface thereof The disk is fixedly secured to the one end of the rotary shaft by means of a plurality of set screws threadably engaged into the plurality of threaded holes formed in the rotary shaft such that the disk is rotatable about a rotational center defined by the axis of the rotary shaft. The rotary encoder further comprises a plurality of electrical contacts adapted for fixed mounting and so arranged as to be in contact with the conductive pattern depending on the angular position of the disk such that various combinations of the plurality of electrical contacts may be electrically interconnected one another depending on the angular position of the disk. The plurality of threaded holes and the plurality of set screws are located off-center with respect to the rotational center of the disk and along a circle centered to the rotational center of the disk. The conductive pattern has a central portion covering the region of the rotational center of the disk. The plurality of electrical contacts include a centered electrical contact so arranged as to be in contact with the conductive pattern substantially at the rotational center of the disk.

The rotary encoder may be provided in an electronic apparatus having electronics circuitry defining a system ground, with the centered electrical contact being connected to the system ground.

BRIEF DESCRIPTION OF THE DRAWING

The above and other objects, features and advantages of the present invention will be apparent from the following detailed description of a preferred embodiment thereof, reference being made to the accompanying drawings, in which.

DETAILED DESCRIPTION OF PREFERRED EMBODIMENTS

Referring now to the accompanying drawings, a preferred embodiment of the present invention will be described in detail.

Figure 1:
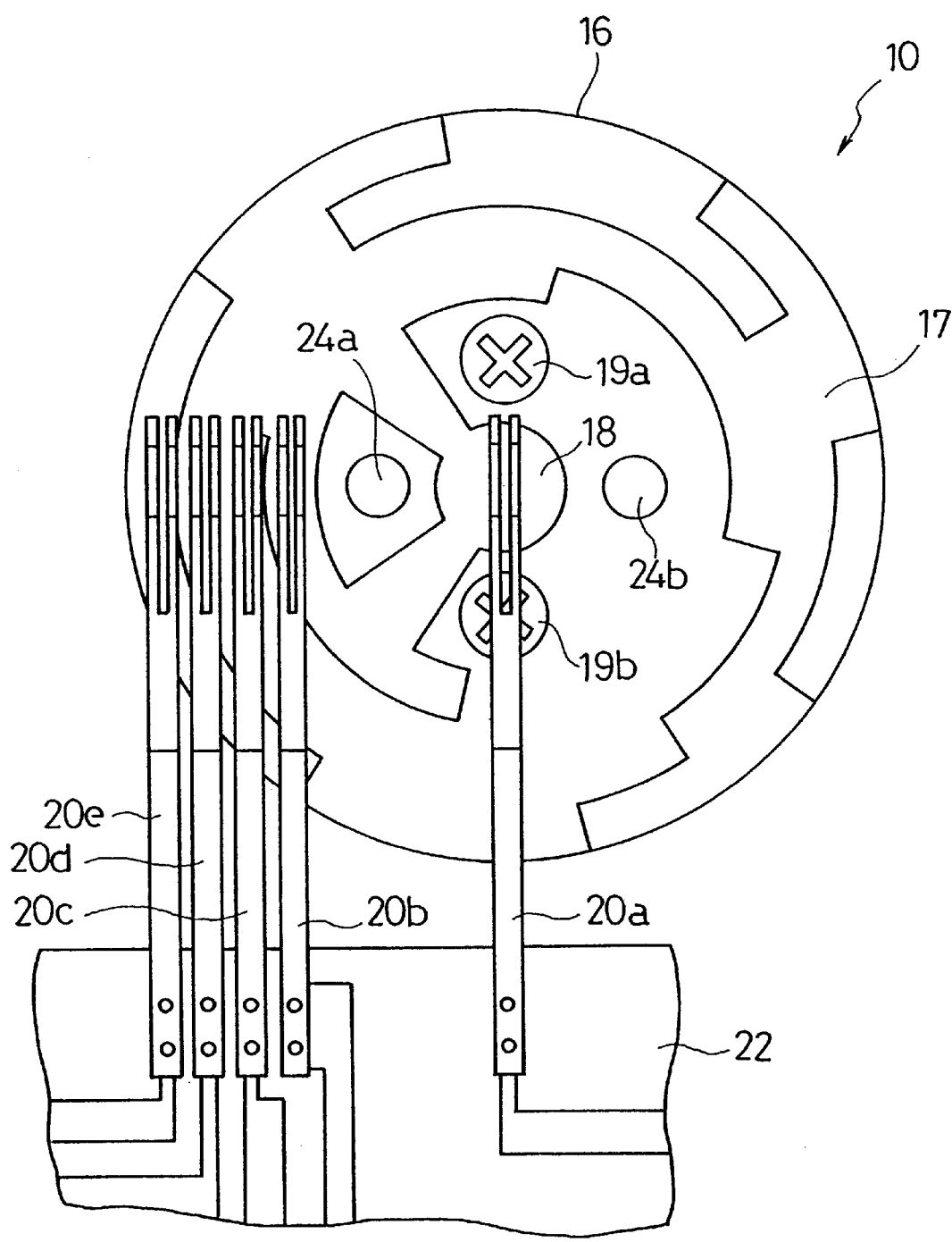
FIG. 1 is a front view of an rotary encoder in accordance with a preferred embodiment of the present invention.
Figure 2:
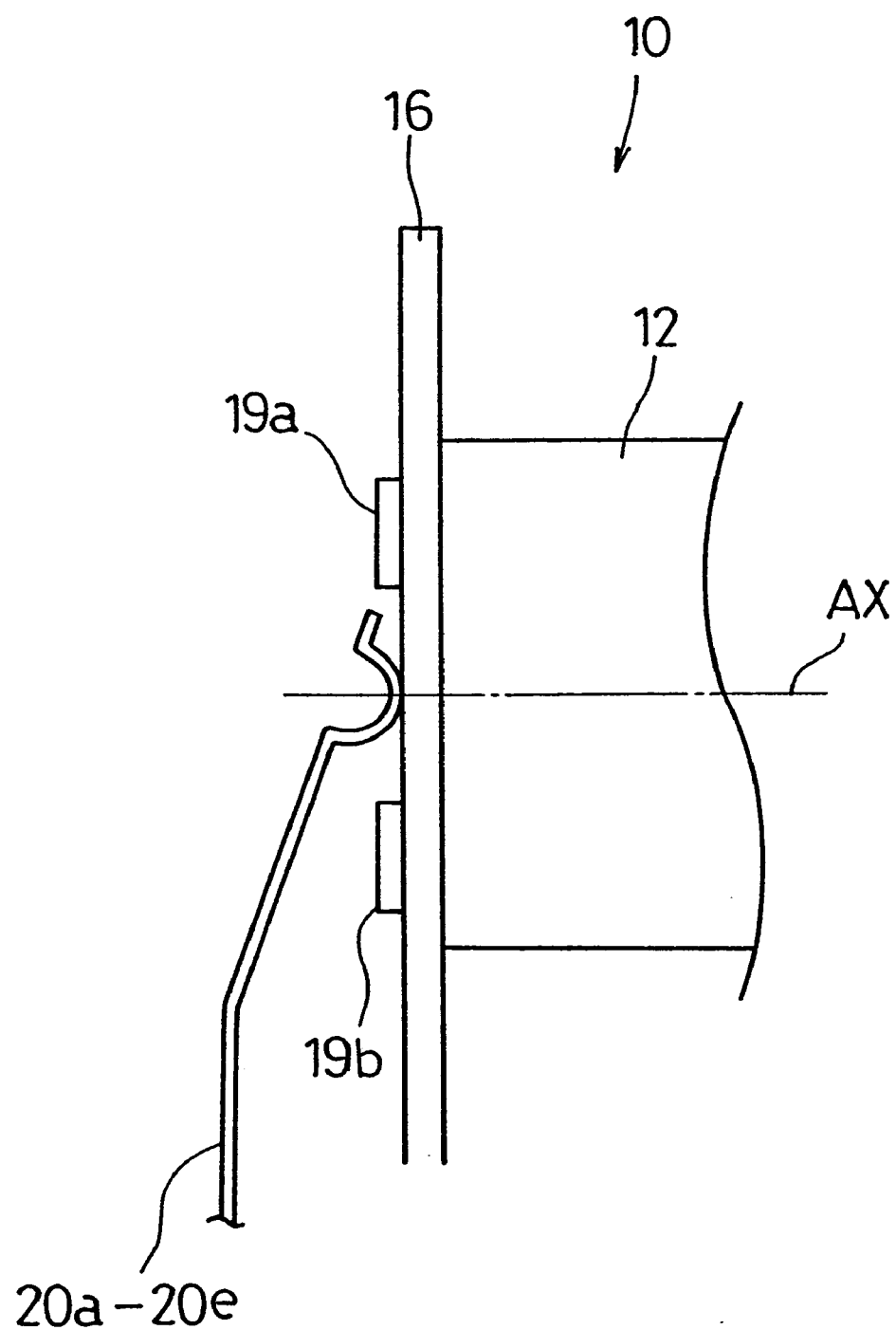
FIG. 2 is a side view of the rotary encoder of FIG. 1.
Figure 3:
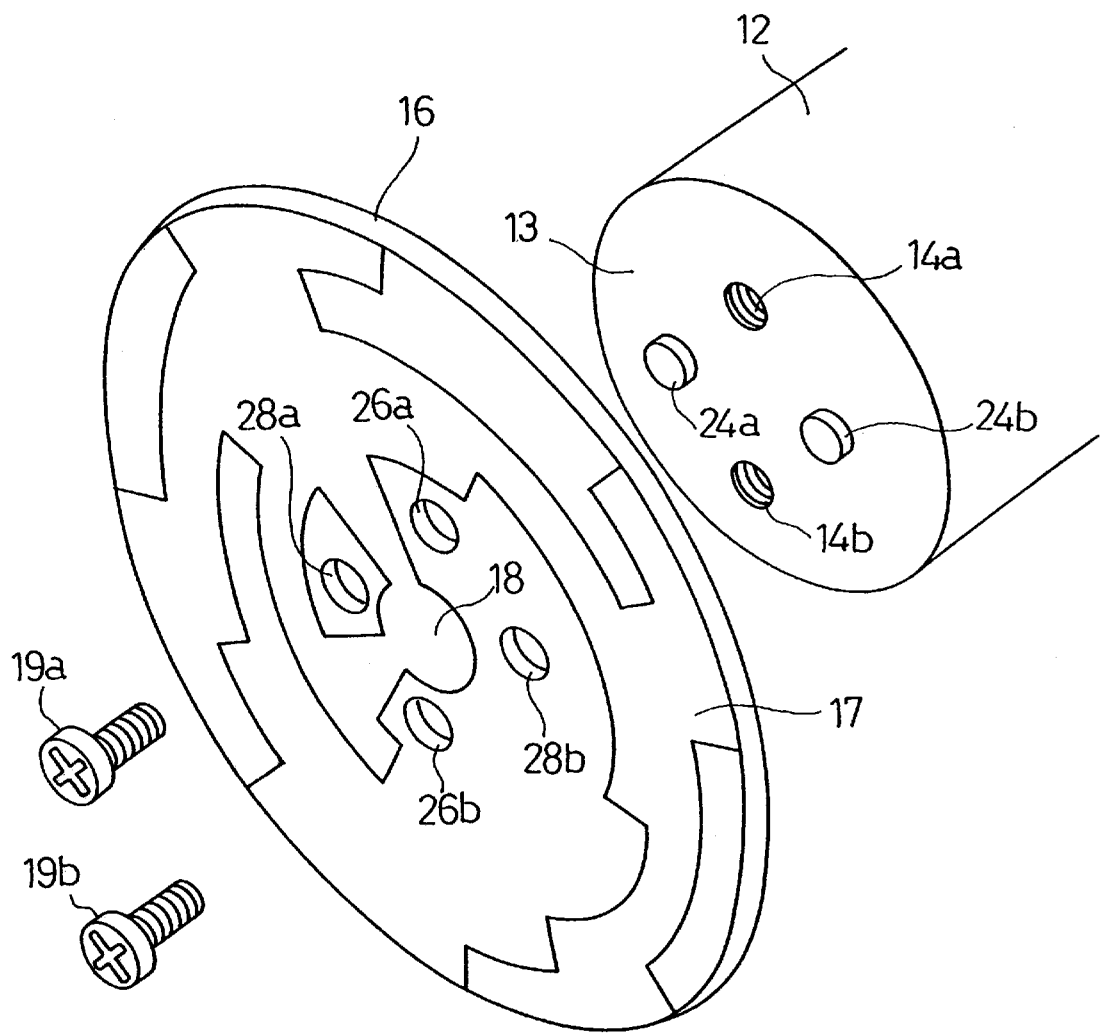
FIG. 3 is an exploded view of some critical elements of the rotary encoder of FIGS. 1 and 2.

FIGS. 1 to 3 show a rotary encoder 10 in accordance with a preferred embodiment of the present invention. The rotary encoder 10 is provided in an electronically-controlled camera, which is an electronic apparatus having electronics circuitry defining a system ground.

The rotary encoder 10 comprises a rotary shaft 12 adapted to be supported for rotation about its axis AX (FIG. 2). As shown in FIG. 3, the rotary shaft 12 has a pair of axially-extending, threaded holes 14a and 14b formed therein at its one end. In this embodiment, the rotary shaft 12 is supported by the body frame of the camera and has a shutter speed selection dial (not shown) attached to the other end thereof for operation by the user of the camera. The shutter speed selection dial is provided with a conventional click mechanism (not shown) for retaining the dial at any one of sixteen, predefined angular positions. Thus, the angular position of the dial may be set by the user to any one of the sixteen positions. The rotary encoder 10 serves to allow the electronics circuitry of the camera to identify the current position of the dial among the sixteen positions.

The rotary encoder 10 further comprises a disk 16 made of an insulating substrate with a conductive pattern 17 formed on a side surface of the substrate. The disk 16 is fixedly secured to the one end of the rotary shaft 12 by means of a pair of set screws 19a and 19b threadably engaged into the pair of threaded holes 14a and 14b, respectively, formed in the rotary shaft 12 such that the disk 16 is rotatable about a rotational center defined by the axis AX of the rotary shaft 12. The rotary encoder 10 further comprises five electrical contacts 20a, 20b, 20c 20d and 20e adapted for fixed mounting. The electrical contacts 20a–20e are so arranged as to be in contact with the conductive pattern 17 depending on the angular position of the disk 16 such that various combinations of the electrical contacts 20a–20e may be electrically interconnected one another depending on the angular position of the disk 16.

More specifically, the disk 16 is made of a printed circuit board comprising a relatively thin insulating substrate having sufficient strength and stiffness, such as a glass-fiber reinforced epoxy board, with a layer of copper foil formed on one side surface thereof. The printed circuit board is processed using known etching techniques to form the conductive pattern 17 on the side surface of the insulating substrate.

The electrical contacts 20a–20e are made of a very thin metal plate having sufficient resiliency and strength, such as a phosphor bronze plate. The electrical contacts 20a–20e each comprises a brush, which is an elongate, thin metal strip having a bifurcated distal end. In this embodiment, the electrical contacts 20a–20e are fixedly mounted, at their proximal ends, on a circuit board 22 for the electronics circuitry of the camera. The distal ends of the electrical contacts 20a–20e are pressed against the surface of the disk 16 or the conductive pattern 17 by means of the resiliency of the electrical contacts 20a–20e themselves so as to be retained in slipping contact with the surface of the disk 16 or the conductive pattern 17. As shown in FIG. 3, the rotary shaft 12 has a flat end surface 13 at its end facing to the disk 16. The pair of threaded holes 14a and 14b are formed in the flat end surface 13. The rotary shaft further has a pair of axially-extruding protrusions 24a and 24b formed on the flat end surface 13. The threaded holes 14a and 14b and the protrusions 24a and 24b are located along a circle centered to the axis AX of the rotary shaft 12, and thus to the rotational center of the disk 16 defined by the axis AX, with equal angular intervals of 90 degrees. Therefore, the threaded holes 14a and 14b and the protrusions 24a and 24b are located off-center with respect to the axis AX of the rotary shaft 12, and thus to the rotational center of the disk 16.

The disk 16 has four holes 26a, 26b, 28a and 28b formed therein and located on a circle centered to the rotational center of the disk 16 with equal angular intervals of 90 degrees. The locations of the holes 26a, 26b, 28a and 28b correspond to the locations of the threaded holes 14a and 14b and the protrusions 24a and 24b, respectively. The axial protrusions 24a and 24b are received in two of the four holes in the disk 16, the holes 28a and 28b, and thereby the relative angular position of the disk 16 to the rotary shaft 12 is defined and any angular displacement between them is prevented. A pair of set screws 19a and 19b are passed through the remaining two of the four holes in the disk 16, the holes 26a and 26b, and threadably engaged into the pair of threaded holes 14a and 14b, respectively, in the rotary shaft 12 such that the disk 16 is fixedly secured to the rotary shaft 12.

This structure for securing the disk 16 to the rotary shaft 12, when combined with the arrangement of the conductive pattern 17 and the electrical contacts 20a–20e as described in more detail below, will provide advantages of the present invention.

The conductive pattern 17 is a one-piece or continuous pattern and has a central portion 18 covering the region of the rotational center of the disk 16. The five electrical contacts 20a–20e include a centered electrical contact 20a so arranged as to be in contact with the conductive pattern 17 substantially at the rotational center of the disk 16, while the remaining four of the electrical contacts, as designated by 20b–20e, are off-centered electrical contacts, which are arranged to lie side-by-side and adapted to be in slipping-contact with the conductive pattern 17 at locations off-center with respect to the rotational center of the disk 16.

More specifically, there are defined on the surface of the disk 16 four annular, concentric, slipping-contact areas corresponding to the four off-centered electrical contacts 20b–20e, respectively. The annular area for the innermost (or the nearest to the rotational center of the disk 16) of the four electrical contacts, as designated by 20b, is divided into two regions covered and not covered by the conductive pattern 17. The annular area for the next innermost of the four electrical contacts, 20c, is also divided into two regions covered and not covered by the conductive pattern 17, but the phase, or the angular position, of these two regions is shifted from those of the annular area for the innermost 20b by 90 degrees. The annular area for the third innermost of the four electrical contacts, 20d, is divided into four arcuate regions alternately covered and not covered by the conductive pattern 17. Similarly, the annular area for the outermost of the four electrical contacts, 20e, is divided into eight arcuate regions alternately covered and not covered by the conductive pattern 17.

In the above arrangement of the electrical contacts 20a–20e, the centered electrical contact 20a will be continuously in contact with the conductive pattern 17 irrespective of the angular position of the disk 16. In this embodiment, the centered electrical contact 20a is connected to the system ground of the electronics circuitry of the camera.

Each of the four off-centered electrical contacts 20b–20e will be selectively in or out of contact with the conductive pattern 17 depending on the angular position of the dial connected to the rotary shaft 12, which position may be any one of the sixteen possible positions defined by the click mechanism. In this embodiment, the off-centered electrical contacts 20b–20e are connected to a positive voltage source (not shown) through respective pull-up resistors (not shown), such that they are pulled up to the potential of the voltage source when out of contact with the conductive pattern 17.

Thus, when the dial is in a particular angular position, some of the off-centered electrical contacts 20b–20e may be in contact with the conductive pattern 17 and thereby caused to be at ground potential, and the other may be out of contact with the conductive pattern 17 and thereby caused to be at the potential of the voltage source. From the combination of the potentials of the four off-centered electrical contacts 20b–20e, the electronics circuitry of the camera identifies the angular position of the dial to be one of the sixteen possible positions.

In the rotary encoder in accordance with the embodiment of the present invention described above, two set screws 19a and 19b located off-center with respect to the rotational center of the disk 16 are used to secure the disk 16 to the rotary shaft 12. This provides an improvement to a typical conventional arrangement in which a single set screw located at the rotational center of the disk is used for the same purpose, which is however apt to loosen during use. Further, one of the electrical contacts, the centered electrical contacts 20a, is arranged to be in contact with the conductive pattern 17 substantially at the rotational center of the disk 16. This effectively uses the central region on the disk 16, which is free from a set screw according to the present invention. This arrangement takes into consideration the fact that in many applications one of the electrical contacts of a rotary encoder is arranged to be in continuous contact with the conductive pattern on the disk.

As apparent from the above, according to the present invention, by virtue of the unique combination of the structure for securing the disk to the rotary shaft and the arrangement of the conductive pattern and the electrical contacts, the overall size of the rotary encoder may be effectively minimized while the disk may be safely secured to the rotary disk with reduced possibility of loosening during use.

Having described the present invention with reference to the preferred embodiment thereof, it is to be understood that the present invention is not limited to the disclosed embodiment, but may be embodied in various other forms without departing from the spirit and the scope of the present invention as defined by the appended claims.

What is claimed is:

1. A rotary encoder comprising:
a rotary shaft adapted to be supported for rotation about its axis and having at least one axially-extending, threaded hole formed therein at its one end;
a disk made of an insulating substrate with a conductive pattern formed on a side surface thereof;
said disk being fixedly secured to said one end of said rotary shaft by means of at least one set screw threadably engaged into said at least one threaded hole formed in said rotary shaft such that said disk is rotatable about a rotational center defined by said axis of said rotary shaft;
a plurality of electrical contacts adapted for fixed mounting and so arranged as to be in contact with said conductive pattern depending on the angular position of said disk such that various combinations of said plurality of electrical contacts being electrically interconnected one another depending on the angular position of said disk;
said at least one threaded hole and said at least one set screw being located off-center with respect to said rotational center of said disk;
said conductive pattern having a central portion covering the region of said rotational center of said disk; and
said plurality of electrical contacts including a centered electrical contact so arranged as to be in contact with said conductive pattern substantially at said rotational center of said disk.

2. A rotary encoder according to claim 1, wherein:
said rotary encoder is provided in an electronic apparatus having electronics circuitry defining a system ground; and
said centered electrical contact is connected to said system ground.

3. A rotary encoder comprising:
a rotary shaft adapted to be supported for rotation about its axis and having a plurality of axially-extending, threaded holes formed therein at its one end;
a disk made of an insulating substrate with a conductive pattern formed on a side surface thereof;
said disk being fixedly secured to said one end of said rotary shaft by means of a plurality of set screws threadably engaged into said plurality of threaded holes formed in said rotary shaft such that said disk is rotatable about a rotational center defined by said axis of said rotary shaft;
a plurality of electrical contacts adapted for fixed mounting and so arranged as to be in contact with said conductive pattern depending on the angular position of said disk such that various combinations of said plurality of electrical contacts being electrically interconnected one another depending on the angular position of said disk;
said plurality of threaded holes and said plurality of set screws being located off-center with respect to said rotational center of said disk and along a circle centered to said rotational center of said disk;
said conductive pattern having a central portion covering the region of said rotational center of said disk; and
said plurality of electrical contacts including a centered electrical contact so arranged as to be in contact with said conductive pattern substantially at said rotational center of said disk.

4. A rotary encoder according to claim 3, wherein:
said rotary encoder is provided in an electronic apparatus having electronics circuitry defining a system ground; and
said centered electrical contact is connected to said system ground.

5. A rotary encoder according to claim 3, wherein:

said rotary shaft has a flat end surface facing to said disk;

said rotary shaft has said plurality of threaded holes formed in said flat end surface;

said rotary shaft has a plurality of axially-extruding protrusions formed on said flat end surface;

said disk has a plurality of holes for receiving said plurality of protrusions of said rotary shaft; and said plurality of protrusions are located along said circle along which said plurality of threaded holes are located.

* * * * *